(12) United States Patent
Heid et al.

(10) Patent No.: US 7,602,182 B2
(45) Date of Patent: Oct. 13, 2009

(54) MAGNETIC RESONANCE SYSTEM HAVING A BASE BODY AND A PATIENT BED AND INDUCTIVE OR CAPACITIVE SIGNAL TRANSMISSION

(75) Inventors: Oliver Heid, Gunzenhausen (DE); Markus Vester, Nürnberg (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 11/993,932

(22) PCT Filed: Sep. 28, 2006

(86) PCT No.: PCT/EP2006/066856
§ 371 (c)(1),
(2), (4) Date: Dec. 26, 2007

(87) PCT Pub. No.: WO2007/060052
PCT Pub. Date: May 31, 2007

(65) Prior Publication Data
US 2008/0197849 A1  Aug. 21, 2008

(30) Foreign Application Priority Data
Nov. 28, 2005  (DE) .................. 10 2005 056 711

(51) Int. Cl.
*G01V 3/00* (2006.01)
(52) U.S. Cl. .................................... 324/307
(58) Field of Classification Search .......... 324/300–322
See application file for complete search history.

(56) References Cited
U.S. PATENT DOCUMENTS

| | | | |
|---|---|---|---|
| 4,680,549 A | 7/1987 | Tanttu | |
| 5,065,760 A | 11/1991 | Krause et al. | |
| 5,243,289 A | 9/1993 | Blum et al. | |
| 5,327,898 A * | 7/1994 | Yoshino et al. | 600/422 |
| 5,939,883 A | 8/1999 | Green et al. | |
| 6,008,649 A * | 12/1999 | Boskamp et al. | 324/318 |
| 6,011,393 A * | 1/2000 | Kaufman et al. | 324/318 |
| 6,144,203 A * | 11/2000 | Richard et al. | 324/318 |
| 6,157,193 A | 12/2000 | Renz et al. | |
| 6,169,400 B1 * | 1/2001 | Sakuma | 324/318 |

(Continued)

FOREIGN PATENT DOCUMENTS

DE    42 38 831 A1    5/1994

(Continued)

*Primary Examiner*—Brij B. Shrivastav
*Assistant Examiner*—Dixomara Vargas
(74) *Attorney, Agent, or Firm*—Schiff Hardin LLP

(57) ABSTRACT

A magnetic resonance system has a base body embodying a magnet system that generates magnetic fields in an excitation region, a patient bed that is movable, with a patient thereon through the base body, a local coil that is operable to detect magnetic resonance signals from the patient, and an evaluation device that evaluates the magnetic resonance signals detected by the local coil. A base body coupling element, at a predetermined base body location, is connected to the evaluation device and inductively or capacitively couples with a patient bed coupling element, located at a predetermined patient bed location, that is connected to the local coil. The magnetic resonance signals are fed from the local coil to the evaluation device via the patient bed coupling element and the base body coupling element.

24 Claims, 8 Drawing Sheets

U.S. PATENT DOCUMENTS

| | | |
|---|---|---|
| 6,552,546 B2 | 4/2003 | Greim |
| 6,590,395 B2 | 7/2003 | Reykowski et al. |
| 6,640,364 B1 * | 11/2003 | Josephson et al. ............... 5/601 |
| 6,693,428 B2 * | 2/2004 | Udo et al. .................... 324/318 |
| 7,212,002 B2 * | 5/2007 | Greim et al. ................. 324/318 |
| 7,330,030 B2 * | 2/2008 | Nakabayashi ................ 324/318 |
| 7,463,031 B2 * | 12/2008 | Kato .......................... 324/318 |
| 2002/0021128 A1 | 2/2002 | Kuhara |
| 2004/0066195 A1 | 4/2004 | Reykowski |
| 2005/0134270 A1 | 6/2005 | Dumoulin et al. |
| 2007/0124858 A1 * | 6/2007 | Ahlman ..................... 5/81.1 R |

FOREIGN PATENT DOCUMENTS

| | | |
|---|---|---|
| EP | 0 437 049 A2 | 7/1991 |
| JP | 06090925 | 4/1994 |

* cited by examiner

MAGNETIC RESONANCE SYSTEM HAVING A BASE BODY AND A PATIENT BED AND INDUCTIVE OR CAPACITIVE SIGNAL TRANSMISSION

BACKGROUND OF THE INVENTION

1. Field of the Invention

The present invention concerns a magnetic resonance system of the type having a base body and a patient bed, wherein the base body contains a magnet system that generates magnetic fields in an excitation region to excite nuclear spins in a patient in the excitation region, and wherein the patient bed is movable in a travel direction relative to the base body.

2. Description of the Prior Art

Magnetic resonance systems of the above type are generally known.

Conventionally the acquisition of the magnetic resonance signals emitted by the examination subject ensues either with a whole-body antenna or with local coils. If the magnetic resonance signal is acquired by a whole-body antenna, the magnetic resonance signal can be acquired from the entire excitation region. The acquisition is possible only with relatively low signal-to-noise ratio (SNR). Therefore in many cases local coils are also used in magnetic resonance systems, often multiple local coils. The local coils are arranged in proximity to the examination subject (normally a person) and can therefore acquire with good SNR, even if only from a small part of the excitation region. Moreover, due to the spatial resonance by the arrangement of the local coils the spatial coding with gradient fields can as such be extended. The required measurement time for an acquisition can thus be reduced.

In order to be able to utilize the advantages of local coils for imaging of the entire body of a person from head to foot, a large number of local coils is required that are placed on the patient in a number of planes arranged along the travel direction of the patient bed. These planes are often designated as levels.

The excitation region typically exhibits a length of approximately 40 to 60 cm as viewed in the patient bed travel direction. Only a portion of the body of the person can therefore ever be imaged, namely the portion that is located in the excitation region. For this reason the patient bed with the patient located thereupon must be moved bit by bit through the excitation region. The local coils located in the excitation region must respectively be activated and be connected with an evaluation device for evaluation of magnetic resonance signals. The other local coils can be deactivated. It is thereby possible to manage with a relatively low number of reception channels even though many local coils are present.

In conventional magnetic resonance systems the aforementioned type of examination is conducted by connecting all local coils, via a corresponding number of plugs at the patient bed and via a movable cable harness, to an evaluation device that is arranged at the base body i.e., the stationary part of the MR apparatus. Due to the attenuation of the long, thin cables that are used, pre-amplifiers must be arranged in the local coils. Each local coil must furthermore have a detuning circuit in order to be able to be deactivated upon non-usage and given transmission. Complicated common mode chokes (known as sheath wave barriers) must also be inserted into the long cable harness in order to be able to limit induced voltages that occur in the transmission mode.

For the back region of the patient it is possible to arrange the acquisition array in a fixed manner under the movable patient bed in the excitation region. In this case the number of these local coils must only be sufficient for the excitation region. If the examination concerns the back region of the patient, it is therefore possible to save many local coils, their cabling and the channel selection. The distance from the examination subject is increased only by the relatively slight thickness of the patient bed itself, which is most cases quite tolerable.

By contrast, this procedure cannot be used or can just barely be realized on the top side of the examination subject since the thicknesses of the patient and the various body regions of the patient are very different. Primarily for thin patients or, for example, at the head or legs, an acquisition coil array permanently installed in the excitation region would be far removed from the body surface, such that the advantage of the local coils (namely a high spatial resolution and a good SNR) would be lost.

A plug connection for local coils that operates without contact (namely via inductive coupling) is known from DE 101 30 615 C2. This teaching already represents an advance since a galvanic contact between the local coil and the evaluation device is no longer required for coupling of a local coil to the evaluation device. However, as before the requirement of an active plugging of the connection by an operating personnel exists. The local coil must also be manually connected to the evaluation device or disconnected therefrom.

From DE 35 00 456 C2 it is known to couple a local coil with the whole-body antenna. Here a contactless coupling is in fact realized. However, this coupling is only possible for a single coil, and even then only given a suitable orientation of the local coil. The teaching of DE 35 00 456 C2 thus cannot be extended to a number of local coils. Here as well the local coil must be actively connected to the whole-body antenna or disconnected therefrom.

From EP 0 437 049 A2 it is known to directly, inductively couple one local coil to another coil that is arranged in the immediate proximity of the local coil. Again, the local coil must be actively connected to the evaluation device or disconnected from it.

A magnetic resonance system with a local coil is known from DE 197 51 017 A1, wherein the local coil is inductively coupled with a decoupling coil which is connected with the evaluation device via electrical conductors.

A magnetic resonance system with a local coil is known from U.S. Pat. No. 5,243,289, wherein the local coil is connected with coupling elements which are inductively coupled with an inductor, and the inductor is connected with the evaluation device. The degree of the inductive coupling can be adjusted by variation of the relative position (distance and/or overlap) of the inductor and the coupling elements.

A magnetic resonance system with a local coil is known from DE 39 35 082 D1, wherein the local coil is connected to a plug connection that is arranged at the patient bed.

SUMMARY OF THE INVENTION

An object of the present invention is to further develop as magnetic resonance system of the aforementioned type such that a local coil can be automatically coupled with an evaluation device when it is located in the excitation region and is otherwise caused to be decoupled from the evaluation device.

The object is achieved via a magnetic resonance system of the aforementioned type wherein a base body coupling element that is connected with an evaluation device for evaluation of magnetic resonance signals is arranged at the base body at a predetermined base body location, a patient bed coupling element that is connected with a local coil for acquisition of a magnetic resonance signal is arranged at a predetermined patient bed location at the patient bed, and the base body coupling element and the patient bed coupling element are arranged and fashioned such that the magnetic resonance signal acquired by the local coil can be fed via the patient bed coupling element and the first base body coupling element to the evaluation device when and as long as the patient bed has moved by a predetermined segment of the travel region.

Naturally, the segment of the travel region must be suitably selected but, this is possible without further measures.

When the patient bed is moved through the travel region and only the patient bed coupling element is present at the patient bed, the base body coupling element remains unutilized when the patient bed has not moved by the segment. Therefore (if the aforementioned base body coupling element is designated as a first lease body coupling element and the segment of the travel region is designated as a first segment of the travel region) a second patient bed coupling element that is connected with a second local coil for acquisition of a magnetic resonance signal is advantageously arranged at the patient bed at a predetermined second patient bed location. In this case the second patient bed coupling element is arranged and fashioned such that the magnetic resonance signal acquired by the second local coil can be fed to the evaluation device via the second patient bed coupling element and the first base body coupling element when and as long as the patient bed has moved by a predetermined second segment of the travel region.

The first and the second segments of the travel region can be disjoint, thus can be spaced from one another or only border one another. However, the predetermined first segment and the predetermined second segment advantageously meet one another in an overlap region. A sliding transition from the first local coil to the second local coil then ensues given movement of the patient bed. It is optimal when the first segment and the second segment are of equal size and the overlap region is approximately half as large as the first segment.

In an analogous manner, the first patient bed coupling element remains unutilized when the patient bed is not moved by the first segment and only the first base body coupling element is present at the base body. A second base body coupling element that is connected with the evaluation device is therefore advantageously arranged at the base body at a predetermined second base body location. The second base body coupling element is then arranged and fashioned such that the magnetic resonance signal acquired by the first local coil can be fed to the evaluation device via the first patient bed coupling element and the second patient bed coupling element when and as long as the patient bed has moved by a predetermined third segment of the travel region. The third segment can be identical with the second segment.

When the first base body coupling element is connected with the evaluation device via a preamplifier, the number of preamplifiers can be minimized. One preamplifier per local coil is then no longer required, rather only one preamplifier per usable acquisition channel.

The excitation region normally extends in the travel direction over an excitation region length that is a multiple of the size of the first segment. The multiple can (but does not have to) be an integer multiple of the size of the first segment.

The travel region likewise normally exhibits a travel region length that is a multiple of the excitation region length. Here it is in fact possible but not absolutely necessary that the multiple is an integer multiple.

The first patient bed coupling element is advantageously fashioned such that it detunes the first local coil when the first local coil cannot be coupled to the evaluation device. An automatic detuning of the first local coil then ensues.

The coupling elements (thus the first base body coupling element and the first patient bed coupling element, possibly also second etc. base body and patient bed coupling elements) can alternatively be fashioned as inductive coupling elements or as capacitive coupling elements. In both cases a number of advantageous embodiments are possible.

In an embodiment of the first coupling elements as inductive coupling elements, for example, it is possible to provide only a simple detuning capacitor between the first patient bed coupling element and the first local coil. However, in this case a degradation of the SNR by 10 to 20% must be accepted. A capacitive transformation circuit comprising a number of capacitors is therefore advantageously arranged between the first patient bed coupling element and the first local coil. The losses of SNR can be limited to approximately 2% by means of such a transformation circuit.

The first patient bed coupling element advantageously has a first patient bed conductor loop and a second patient bed conductor loop that respectively generate a temporally variable magnetic field upon feed of a magnetic resonance signal from the first local coil to the evaluation device, which temporally variable magnetic field is oriented perpendicular to the travel direction, whereby the magnetic fields generated by the patient bed conductor loops are oriented inversely relative to one another at every point in time. The two patient bed conductor loops are then essentially decoupled from the magnet system and are also essentially insensitive for the emitted magnetic resonance signal. The two patient bed conductor loops can thereby alternatively be connected in series or in parallel to one another.

The first base body coupling element is fashioned analogous to the first patient bed coupling element. Here the two base body conductor loops can also alternatively be connected in series or in parallel to one another. The interconnection of the base body conductor loops (in series or in parallel) can thereby be selected independent of the interconnection of the patient bed conductor loops.

As already mentioned, the magnet system comprises a whole-body antenna by means of which an essentially homogeneous, radio-frequency magnetic field can be generated in the entire excitation region. The whole-body antenna in all cases has transmission elements that are oriented parallel to the travel direction. A particularly space-saving arrangement of the first base body coupling element therefore results when the first base body coupling element is arranged between two immediately adjacent transmission elements or is integrated into one of the transmission elements.

In the latter case (integration into one of the transmission elements) it is advantageous for the first and the second whole-body conductor loops have segments running parallel to the travel direction, with capacitors arranged in these segments and the capacitors being dimensioned such that an excitation current oscillating in the appertaining transmission element causes no signal in the first base body coupling element. The first base body coupling element is then decoupled from the appertaining transmission element.

When the coupling elements are fashioned as capacitive coupling elements, it is preferred that the coupling elements are respectively fashioned as a pair of narrow coupling strips. For example, the coupling strips can respectively be approximately 2×10 cm in size and, viewed transverse to the main surface of the coupling strips, the coupling strips of the first patient bed coupling element can be spaced by approximately 0.3 to 1.0 mm from those of the first base body coupling element.

The coupling strips of the first patient bed coupling element are advantageously adjacent to one another on their narrow sides. An unavoidable parasitic capacitive interaction of the coupling strips of the patient bed coupling element with one another is then minimal. The coupling strips of the first base body coupling element are naturally fashioned similarly.

When a choke is connected in parallel with the first patient bed coupling element, an automatic detuning of the local coil is ensured for the case that the appertaining local coil cannot be coupled to the evaluation device.

A protective circuit is advantageously arranged between the first base body coupling element and the evaluation circuit, which protective circuit compensates the series blind resistance of the first local coil, the first patient bed coupling element and the first base body coupling element upon feeding of a magnetic resonance signal from the first local coil via the first patient bed coupling element and the first base body coupling element to the evaluation circuit, and which protective circuit detunes the first base body coupling element when no patient bed coupling element interacts with the first base body coupling element.

Independent of the embodiment of the first base body coupling element as a capacitive or as an inductive coupling element, it is in principle possible to arrange the first base body coupling element outside of the excitation region. However, the first base body coupling element is advantageously arranged within the excitation region.

The first base body coupling element, independent of its concrete embodiment, can likewise advantageously be detuned by means of a blocking circuit. The blocking circuit can, for example, be fashioned as an inductor that is connected via a typical PIN diode.

Furthermore it is possible to operate the local coil not only as an acquisition coil but rather also as a transmission coil. In this case a signal splitter that is connected with an RF driver element is arranged between the first base body coupling element and the evaluation circuit. A magnetic resonance excitation signal emitted by the RF driver element can be fed via the first base body coupling element and the first patient bed coupling element into the first local coil when and as long as the patient bed has moved by the first segment.

DESCRIPTION OF THE PREFERRED EMBODIMENTS

Figure 1:
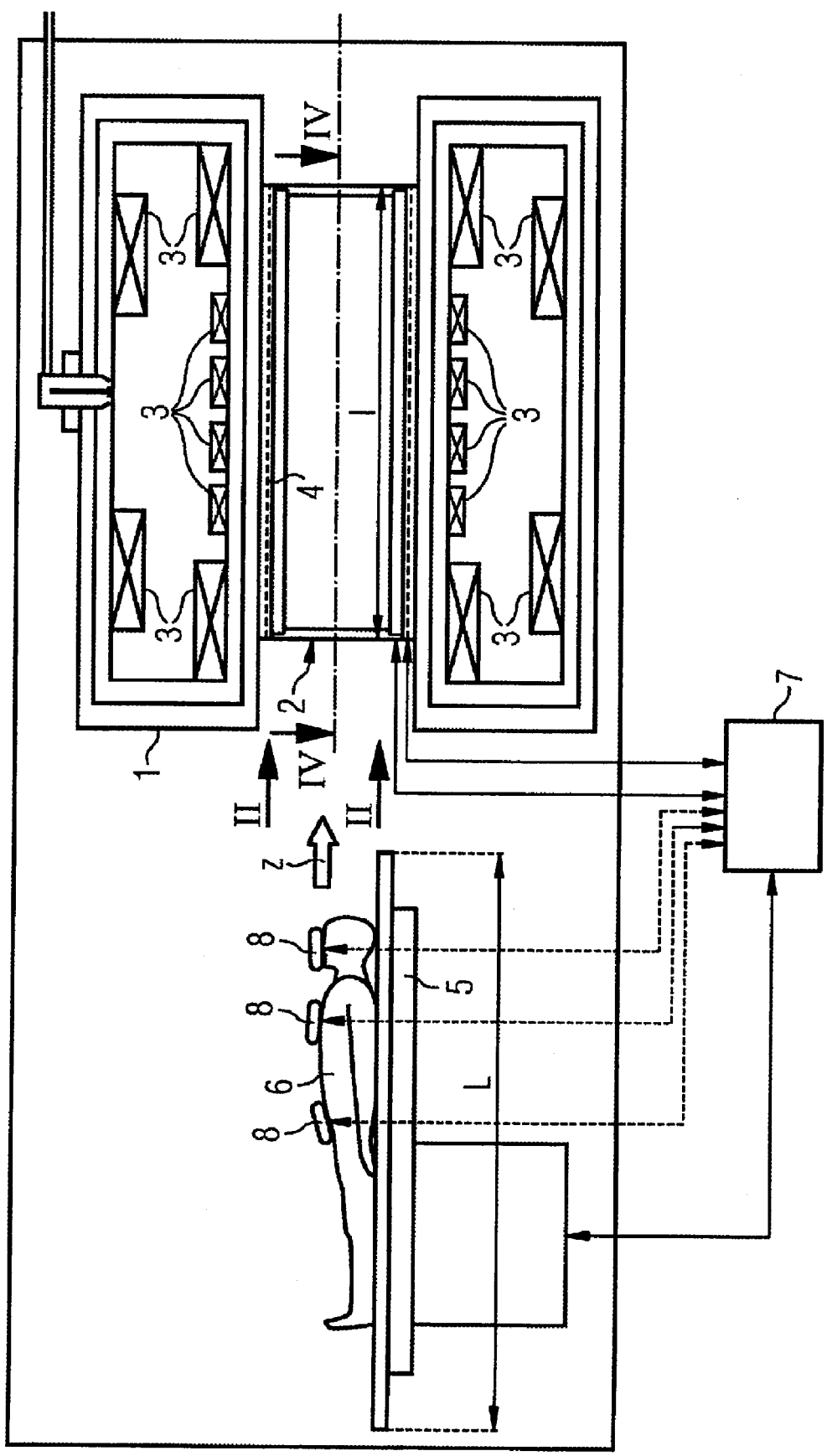
FIG. 1 schematically illustrates a magnetic resonance system.

According to FIG. 1, a magnetic resonance system has a base body 1. The base body 1 embodies a magnet system by means of which magnetic fields can be generated in an excitation region 2.

The magnet system includes at least one basic magnet 3 for generation of a temporally static basic magnetic field that is spatially at least essentially homogeneous within the excitation region 2. The magnet system furthermore includes a whole-body antenna 4 by means of which a radio-frequency magnetic field can be generated that is at least essentially homogeneous in the entire excitation region 2. The magnet system normally additionally includes gradient magnets for generation of gradient fields and a shielding magnet.

The magnetic resonance system according to FIG. 1 furthermore has a patient bed 5. The patient bed 5 can be moved in a travel direction z over a travel region relative to the base body 1. The travel region is determined such that—as viewed in the travel direction z—each point of the patient bed 5 can be positioned in the excitation region 2. Since the excitation region 2 normally extends over an excitation region length l which is approximately 40 to 60 cm in the travel direction z and the patient bed exhibits a length L on the order of 2 m, the travel region length of the patient bed 5 is thus inevitably a multiple of the excitation region length l.

Due to the mobility of the patient bed 5, an examination subject 6 (normally a person 6) can be brought into the excitation region 2 by corresponding movement of the patient bed 5 when said examination subject 6 is arranged on the patient bed 5. If the examination subject 6 is introduced into the excitation region 2, it can thus be excited to emit a magnetic resonance signal via corresponding activation of the magnet system (in particular of the whole-body antenna 4) and generation of suitable magnetic fields corresponding with this.

It is possible to acquire the emitted magnetic resonance signal by means of the whole-body antenna 4 and to feed it to an evaluation device 7 by which the magnetic resonance signal can be evaluated. However, only a qualitatively low-grade reconstruction of the examination subject 6 is possible in this manner. Local coils 8 by means of which a significantly higher-grade magnetic resonance signal can be acquired (even if only over a small volume per local coil 8) are therefore normally arranged on the examination subject 6. In contrast to the prior art, the local coils are not connected with the evaluation device 7 via a cable. The lines between the local coils 8 and the evaluation device 7 are therefore indicated only with dashes in FIG. 1. The type and manner of the connection of the local coils 8 to the evaluation device 7 is the subject matter of the present invention.

Figure 2:
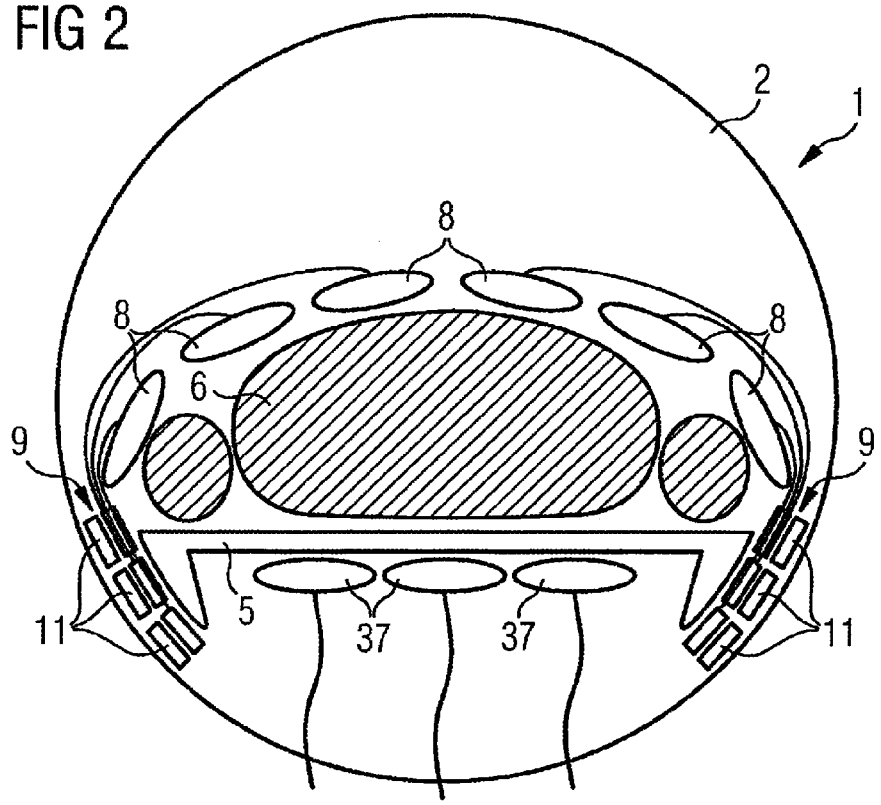
FIG. 2 is a section through the magnetic resonance system of FIG. 1.
Figure 3:
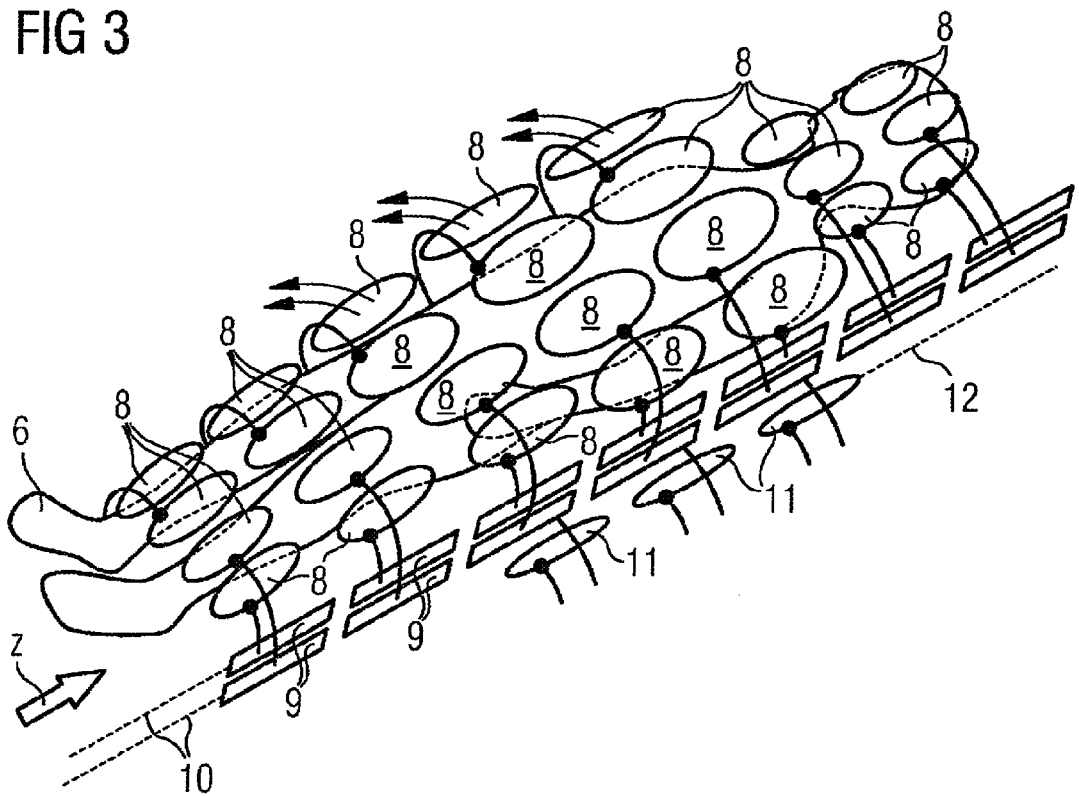
FIG. 3 is a perspective view of a patient bed and base body coupling elements.

As can be seen from FIG. 1 and as shown in more detail in FIG. 2 and 3, many local coils 8 are normally arranged on the examination subject 6. Those local coils 8 that are arranged at essentially the same height (as viewed in the travel direction z) thereby respectively form what is known as a level. Depending on the situation of the individual case, the levels can cover the entire body of the examination subject 6.

Each local coil 8 is connected with a patient bed coupling element 9. A 1:1 association thereby exists. Each local coil 8 is thus connected with a single patient bed coupling element 9 and, in reverse, each patient bed coupling element 9 is also connected with only a single local coil 8. Each patient bed coupling element 9 is arranged at a predetermined point of the patient bed 5. Insofar as it is necessary, these points are subsequently called patient bed points since they are defined with regard to the patient bed 5.

The patient bed coupling elements 9 are arranged in a plurality of rows 10 (see in particular FIG. 3). Each row 10 extends in the travel direction z over a length that is at maximum as large as the length L of the patient bed 5. Each row 10 of patient bed coupling elements 9 can therefore extend at maximum over approximately 2 m as viewed in the travel direction z. Within each row 10 the patient bed coupling elements 9 follow one another with a small interval a. The interval a is typically 8 to 15 cm, in particular 10 to 12 cm.

Furthermore, base body coupling elements 11 that are connected with the evaluation device 7 are arranged at the base body 1 for connection of the local coils 8 to the evaluation device 7. The base body coupling elements 11 are arranged at predetermined points of the base body 1. Insofar as it is necessary, these points are subsequently called base body points since they are defined with relation to the base body 1.

Figure 4:
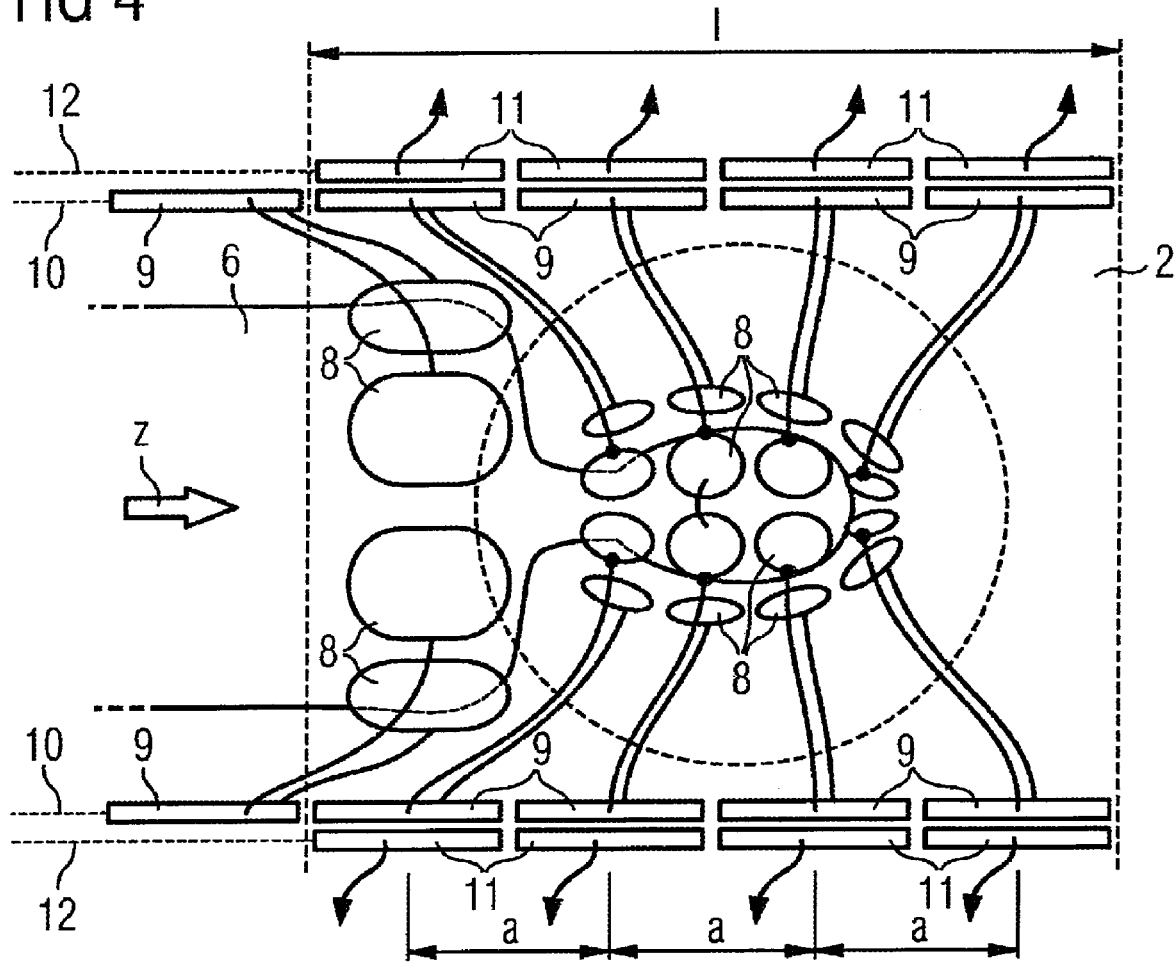
FIG. 4 is a further section through the magnetic resonance system of FIG. 1.

As is apparent from FIGS. 3 and 4, the base body coupling elements 11 are also arranged in rows 12. According to FIG. 4, each row 12 of base body coupling elements 11 likewise extends in the travel direction z, however only over a smaller length than the patient bed 5, namely essentially over the excitation region length l. Each row 12 of base body coupling elements 11 interacts with one of the rows 10 of patient bed coupling elements 9.

From FIG. 4 it is also apparent that the base body coupling elements 11 are arranged in the excitation region 2. Due to the circumstance that a plurality of base body coupling elements 11 are arranged one after another in the excitation region 2 as viewed in the travel direction z, from FIG. 4 it is thus also apparent that an interval a of the base body coupling elements 11 is significantly smaller (as viewed in the travel direction z) than the excitation region length l. The interval a of the base body coupling elements 11 from one another is generally the same as the interval a of the patient bed coupling elements 9 from one another.

The arrangement of the rows 10 of patient bed coupling elements 9 and the arrangement of the rows 12 of base body coupling elements 11 are matched to one another such that the local coils 8 associated with the respective row 10 of patient bed coupling elements 9 can feed the magnetic resonance signals acquired by them to the evaluation device 7 via the patient bed coupling elements 9 of the respective row 10 and the base body coupling elements 11 of the corresponding row 12 of base body coupling elements 11. This naturally only applies when the respective patient bed coupling element 9 of a row 10 of patient bed coupling elements 9 is arranged in the active region of one of the base body coupling elements 11 of the corresponding row 12 of base body coupling elements 11. This is subsequently explained in detail in connection with FIG. 5.

Figure 5:
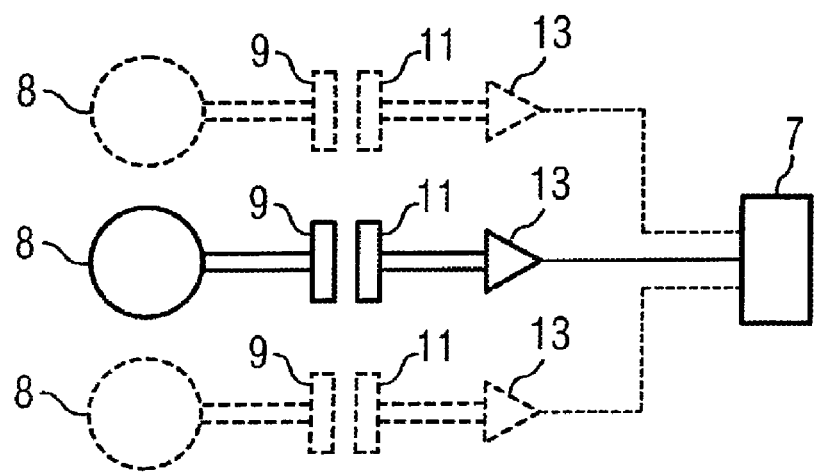
FIG. 5, schematically illustrates arrangements of the patient bed coupling elements relative to base body coupling elements.

A transmission channel is represented in solid lines in FIG. 5. According to FIG. 5, a local coil 8 is thereby connected with a patient bed coupling element 9. The patient bed coupling element 8 couples with a base body coupling element 11. The base body coupling element is connected with the evaluation device 7 via a preamplifier 13.

In all cases a number of such transmission channels exist at a specific point in time. This is represented with dashed lines in FIG. 5 for two further transmission channels, but only the transmission channel indicated in solid lines is considered first in the following. The elements 8, 9, 11 of this transmission channel are subsequently designated as first elements 8, 9, 11, thus as a first local coil 8, first patient bed coupling element 9 and first base body coupling element 11.

When the patient bed 5 is moved over its travel region, the first patient bed coupling element 9 at some point reaches a position that corresponds to the first patient bed coupling element 9 that in FIG. 5 is drawn in dashes above the first patient bed coupling element 9. In this movement position a coupling would in fact possibly exist with the base body coupling element 11 drawn in dashes in FIG above the first base body coupling element 11, however not with the first base body coupling element 11. A degree of coupling k1 of the first patient bed coupling element 9 with the first base body coupling element 11 is thus zero in this travel position (see FIGS. 6 and 7).

When the patient bed 5 is now moved further in the travel direction z, the degree of coupling k1 with which the first patient bed coupling element 9 couples with the first base body coupling element 11 increases gradually toward a maximum value. This state is reached when the first patient bed coupling element 9 and the first base body coupling element 11 are situated precisely opposite one another corresponding to the representation from FIG. 5. After this the degree of coupling k1 gradually decreases again to zero.

The segment of the travel region in which the degree of coupling k1 is greater than zero, is subsequently called the first segment. The magnetic resonance signal can only be fed from the first local coil 8 via the first patient bed coupling element 9 and the first base body coupling element 11 to the evaluation device 7 only when and as long as the patient bed 5 has been moved by this segment of the travel region. The first segment exhibits a size that is at maximum twice as large as the interval a of the base body coupling elements 11 from one another. It is thus significantly smaller than the excitation region length l. This amounts to a multiple of the size of the first segment.

The patient bed coupling elements 9 are normally all designed identically. The base body coupling elements 11 are also normally all designed identically. Therefore, not only can the magnetic resonance signal that is acquired by the first local coil 8 be acquired via the first base body coupling element 11, but rather also the magnetic resonance signals of other local coils 8 insofar as their patient bed coupling element 9 is arranged in the same row 10 as the first patient bed coupling element 9. The patient bed 5 must merely be moved by another segment (subsequently called the second segment) that is specific for the respective other patient bed coupling element 9. The magnetic resonance signal that is acquired by the first local coil 8 can be transferred in an analogous manner not only via the first base body coupling element 11 but also via another base body coupling element 1 to the evaluation device 7 when this other base body coupling element 11 is arranged in the same row 12 of base body coupling elements 11 as the first base body coupling element 11. It is only necessary to move the patient bed by another segment (subsequently called the third segment) that is specific to the respective base body coupling element 11.

Figure 6:
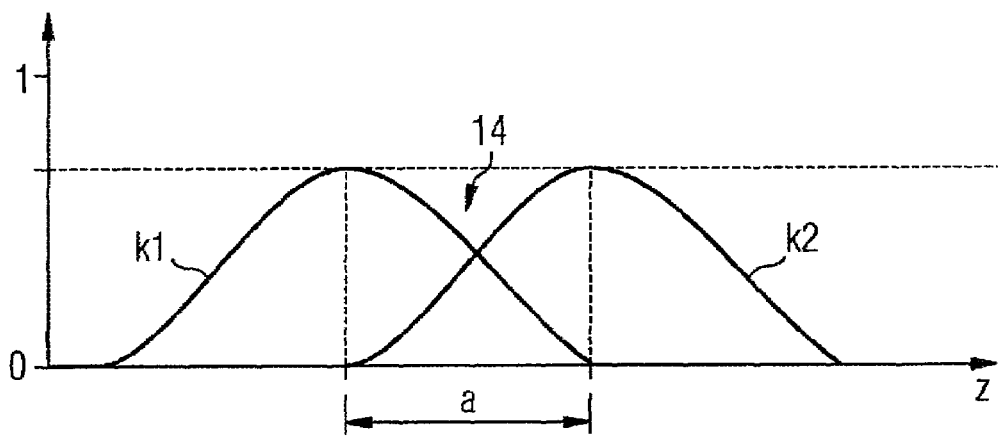
FIG. 6 illustrates degrees of coupling between a patient bed coupling element and adjacent base body coupling elements.

In addition to the degree of coupling k1, a degree of coupling k2 is drawn in FIG. 6 with which the patient bed coupling element 9 (which is drawn dashed in FIG. 5 above the first patient bed coupling element 9) couples with first base body coupling element 11. The first segment and the second segment clearly overlap one another in an overlap region 14. Furthermore, the overlap region 14 is approximately half as large as the first segment. Due to the similar design of the coupling elements 9, 11 and the regular spacing a of the coupling elements 9, 11 from one another, the first and the second segments are also equally large.

Figure 7:
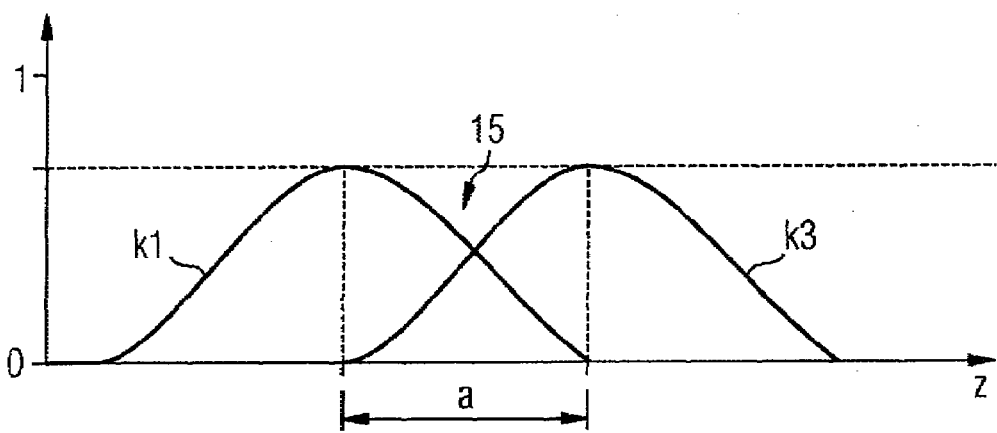
FIG. 7 illustrates degrees of coupling of adjacent patient bed coupling elements with a base body coupling element.

In addition to the degree of coupling k1, a degree of coupling k3 is drawn in FIG. 7 with which the patient bed coupling element 9 couples with first base body coupling element 11 that, in FIG. 5, is drawn dashed below the first base body coupling element 11. The first segment and the third segment also clearly overlap one another in an overlap region 15 that is approximately half as large as the first segment. Furthermore, the third segment is as large as the first segment. The third segment is in particular identical with the second segment.

As already mentioned, the patient bed coupling elements 9 are in all cases designed identically among one another. This is if anything absolutely necessary at least per row 10 of patient bed coupling elements 9. The base body coupling elements 11 are also in all cases designed identically, whereby here as well the same design is necessary within each row 12 of base body coupling elements 11. Rows 10, 12 of patient bed coupling elements 9 and base body coupling elements 11 interacting with one another must also be fashioned such that the respective coupling elements 9, 11 can interact. When the design of a single patient bed coupling element 9 and of a single base body coupling element 11 is subsequently described, this specification is therefore exemplary for all patient bed coupling elements 9 and all base body coupling elements 11 at least of the respective pair of rows 10, 12 of coupling elements 9, 11.

Figure 8:
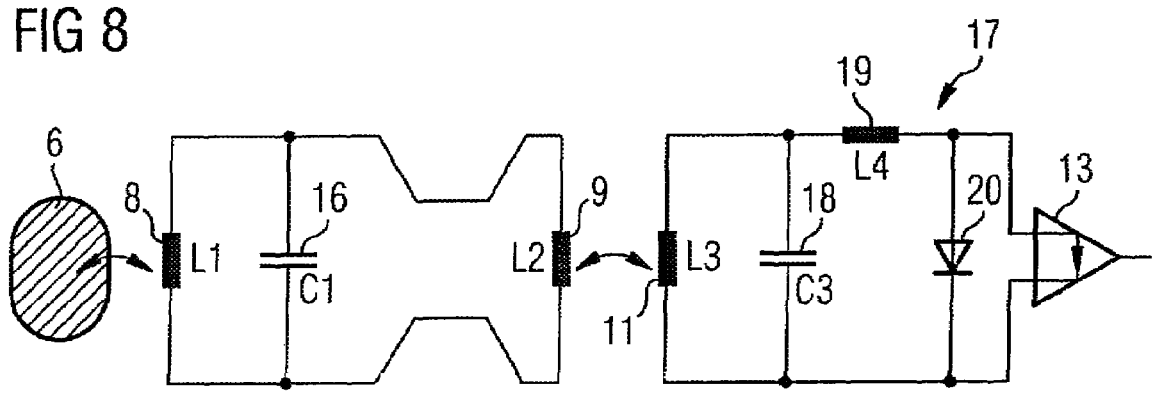
FIG. 8 schematically illustrates the signal flow from a local coil to an evaluation device.

According to FIG. 8, the patient bed coupling element 9 and the base body coupling element 11 are fashioned as inductive coupling elements 9, 11, for example. The local coils 8 therefore exhibit an inductance L1, the patient bed coupling element an inductance L2 and the base body coupling element 11 an inductance L3. The local coil 8 is thereby tuned to the Larmor frequency of the magnetic resonance system by means of a capacitor 16 that exhibits a capacitance C1.

When the patient bed 5 is moved such that the patient bed coupling element 9 couples with none of the base body coupling elements 11, the capacitor 16 and the patient bed coupling element 9 form an oscillating circuit that is resonant at the Larmor frequency of the magnetic resonance system. The patient bed coupling element 9 is therefore fashioned such that it detunes the local coil 8 when the local coil 8 cannot be coupled to the evaluation device 7. For protection against a possible malfunction of the patient bed coupling element 9 it is possible to install a safety element (for example a typical fuse) into the local coil 8 if applicable.

The base body coupling element 11 should likewise be deactivated in an analogous manner when no patient bed coupling element 9 is situated opposite it. A controllable blocking circuit 17 is therefore associated with the base body coupling element 11. In the simplest case the blocking circuit 17 includes a capacitor 18, a coil 19 and a PIN diode 20. The capacitor 18 exhibits a capacitance C3, the coil 19 an inductance L4. If the PIN diode 20 is activated, the coil 19 and the capacitor 18 form a trap circuit that is resonant at the Larmor frequency of the magnetic resonance system. The blocking circuit 17 therefore separates the preamplifier 13 and the base body coupling element 11 from one another. The base body coupling element 11 is thus decoupled from the preamplifier 13 at the Larmor frequency, thus can be detuned by means of the blocking circuit 17.

In contrast to this, when the patient bed 5 is moved such that the base body coupling element 11 couples with the patient bed coupling element 9 differentiation must be made between transmission case and acquisition case.

In the transmission case the blocking circuit 17 is activated. The base body coupling element 11 therefore does not couple with the patient bed coupling element 9, such that the patient bed coupling element 9 furthermore detunes the local coil 8.

In contrast to this, in the acquisition case the blocking circuit 17 is not activated, such that the local coil 8 is coupled to the preamplifier 13 via the patient bed coupling element 9 and the base body coupling element 11. The inductance L4 of the coil 19 is selected such that even in this case the local coil 8 is loaded only at high resistance.

Figure 9:
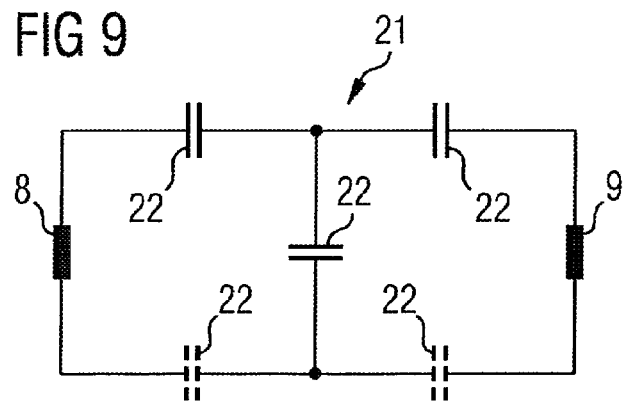
FIGS. 9 and 10 respectively show a local coil and a patient bed coupling element with a capacitive transformation circuit.
Figure 10:
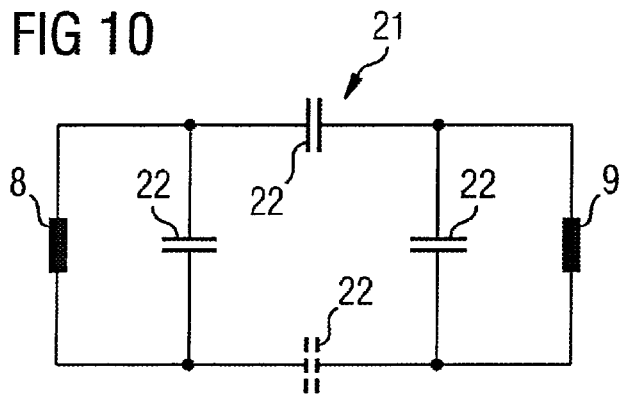

The unit of FIG. 8 composed of the local coil 8, capacitor 16 and patient bed coupling element 9 is functional but exhibits a relatively low SNR. According to FIGS. 9 and 10, a capacitive transformation circuit 21 that comprises a plurality of capacitors 22 is therefore advantageously arranged between the patient bed coupling element 9 and the local coil 8. The capacitors 22 drawn in FIGS. 9 and 10 with solid lines are thereby absolutely necessary; the capacitors 22 drawn with dashed lines are merely optional. The degradation of the SNR to 1 to 2% can be limited with the embodiments according to FIGS. 9 and 10.

The patient bed coupling element 9 should be designed such that it does not couple with the excitation field of the whole-body antenna 4. For this reason the patient bed coupling element 9 according to FIG. 11 advantageously comprises a first and a second patient bed conductor loop 23, 24. When a magnetic resonance signal is fed from the local coil 8 to the patient bed coupling element 9, this magnetic resonance examination signal respectively induces a loop current l1, l2 in both the first and the second patient bed conductor loop 23, 24. Corresponding magnetic fields naturally correspond with the loop currents l1, l2. Since the magnetic resonance signal and thus also the loop currents l1, l2 are radio-frequency, the magnetic fields are temporally variable.

The patient bed conductor loops 23, 24 have segments 25 through 27 that run parallel to the travel direction z. The patient bed conductor loops 23, 24 therefore extend essentially in a plane which contains the travel direction z. The temporally variable magnetic fields are thus oriented perpendicular to the travel direction z. However, since the loop currents l1, l2 flow inversely in the patient bed conductor loops 23, 24, the corresponding magnetic fields are oriented inversely at every point in time.

Figure 11:
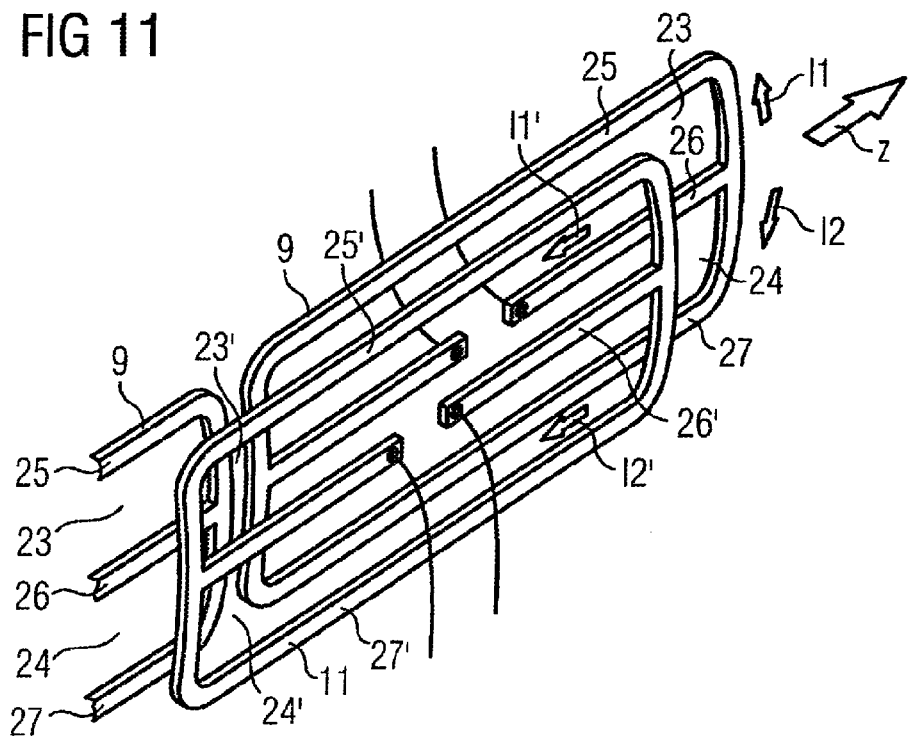
FIG. 11 is an exemplary embodiment of inductive coupling elements.

According to FIG. 11, the two patient bed conductor loops 23, 24 are connected parallel to one another but, they can also be connected in series with one another.

Figure 12:
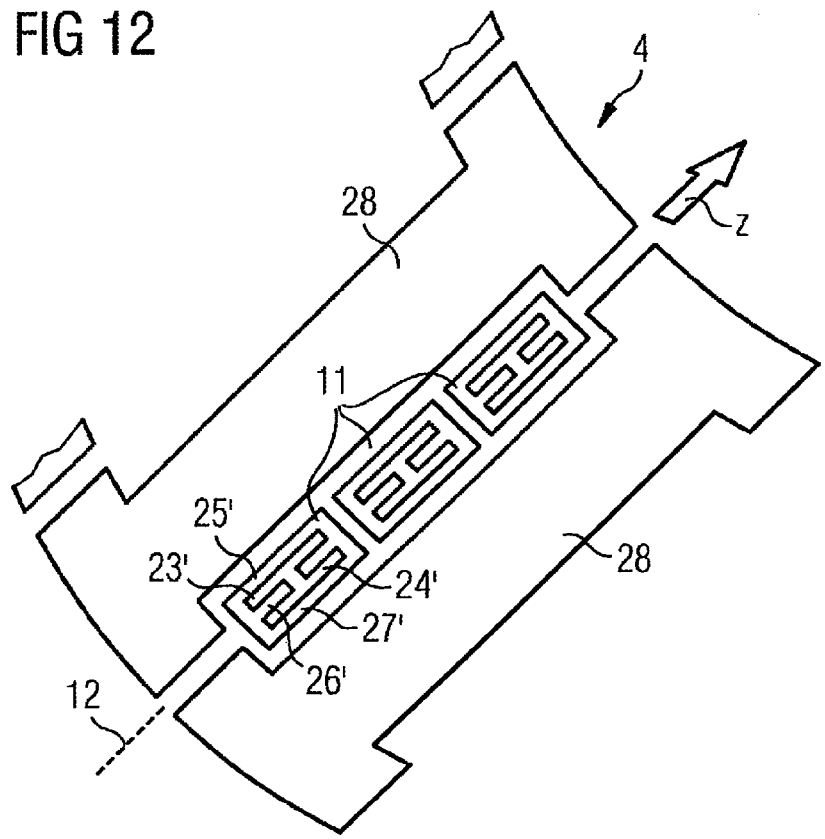
FIG. 12 shows a whole body antenna with base body coupling elements.
Figure 13:
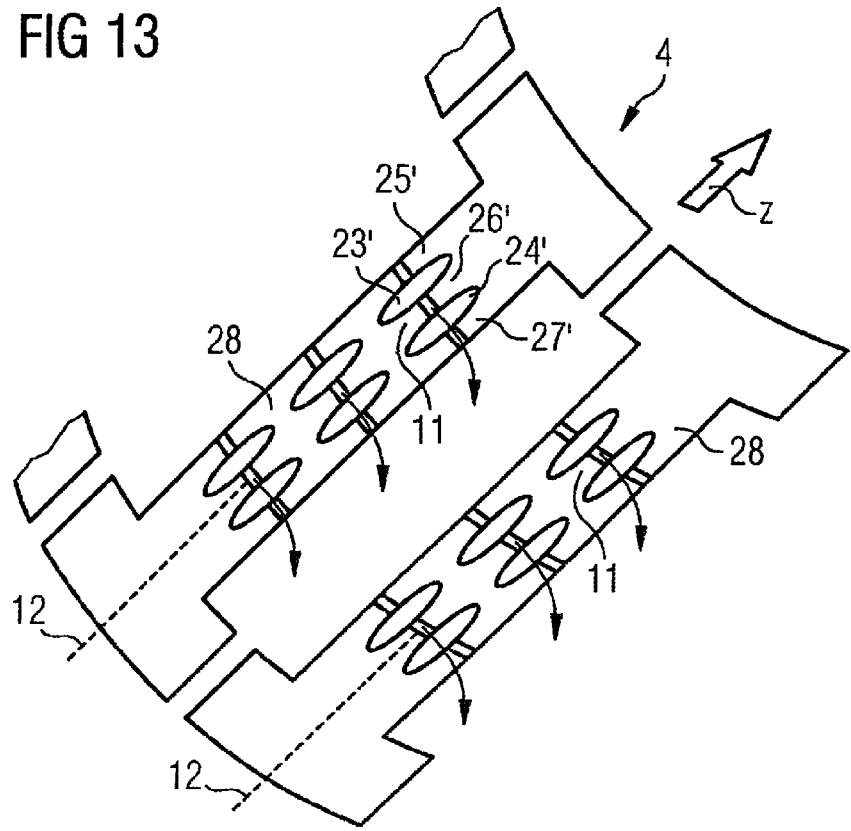
FIG. 13 shows a further embodiment of the arrangement of FIG. 12.

The base body coupling elements 11 can likewise be fashioned like the patient bed coupling elements 9 (see also FIGS. 12 and 13). The individual elements of the base body coupling element 11 are therefore not explained in detail. For differentiation from the corresponding elements of the patient bed coupling element 9, they are provided with a prime. The interconnection of the two base body conductor loops 23', 24' (in series or in parallel) can thereby be the same as in the patient bed coupling element 9. However, it can also be different from that interconnection. Independent of this, however, the magnetic fields generated by the patient bed conductor loops 23, 24 induce temporally variable induction currents 11', 12' in the base body conductor loops 23', 24' that are inversely oriented relative to one another at every point in time.

According to FIGS. 12 and 13, the whole-body antenna 4 comprises a number of transmission elements 29 that are oriented parallel to the travel direction z. According to FIG. 12, the base body coupling elements 11 are respectively arranged between two immediately adjacent transmission elements 28. According to FIG. 13, the base body coupling elements 11 are integrated into the transmission elements 28.

Normally either the embodiment according to FIG. 12 or the embodiment according to FIG. 13 are resorted to. However, in principle a combined embodiment is also possible, thus that a portion of the base body coupling elements 11 is arranged between the transmission elements 28 and another portion of the base body coupling elements 11 is integrated into the transmission elements 28.

Figure 14:
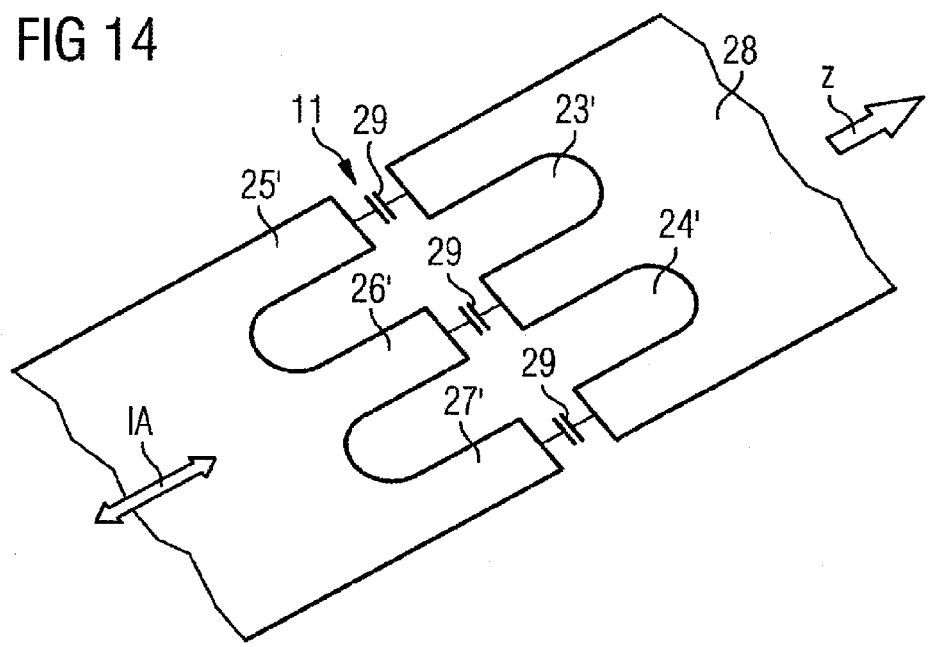
FIG. 14 shows a detail from the embodiment of FIG. 3.

Given this embodiment according to FIG. 13 (see additionally FIG. 14 as well) capacitors 29 are also arranged in the segments 25' through 27' of the base body conductor loops 23', 24', which segments 25' through 27' run parallel to the travel direction z. The capacitors 29 are dimensioned such that the base body coupling elements 11 satisfy two conditions.

The excitation current IA must be distributed to the segments 25' through 27' such that it evokes no signal in the base body coupling element 11. Given the embodiment of FIG. 13 and 14, the capacitances of the two outer capacitors 29 of a base body coupling element 11 must therefore be half as large as the capacitance of the middle capacitor 29 of the appertaining base body coupling element 11. Moreover, the capacitors 29 must exhibit in total an effective capacitance that corresponds to the capacitance C3 of the capacitor 18 from FIG. 8.

As an alternative to the embodiments according to FIGS. 8 through 14, it is naturally also possible that the base body coupling elements 11 and the patient bed coupling elements 9 are fashioned as capacitive coupling elements 9, 11. This is schematically presented in FIG. 15.

Figure 15:
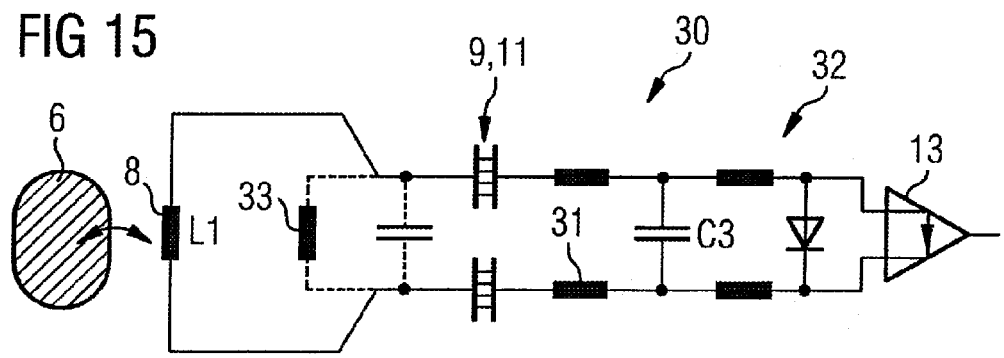
FIG. 15 schematically illustrates the signal flow from a local coil to an evaluation circuit.

Given embodiment in the form of capacitive coupling elements 9, 11, according to FIG. 15 a protective circuit 30 is advantageously arranged between the base body coupling element 11 and the evaluation circuit 7 (or respectively the preamplifier 13). According to FIG. 15, the protective circuit 30 comprises one or (as shown) two chokes 31 as well as a blocking circuit 32. The blocking circuit 32 corresponds to the blocking circuit 17 from FIG. 8 and is therefore not explained in detail in the following.

The protective circuit 30 has two functions. It compensates the series blind resistance of the local coil 8, the patient bed coupling element 9 and the base body coupling element 11 in the event that a magnetic resonance signal is fed from the local coil to the evaluation device 7 via the patient bed coupling element 9 and the base body coupling element 11. Additionally, it detunes the base body coupling element 11 in the event that no patient bed coupling element 9 interacts with the base body coupling element 11, such that the base body coupling element 11 is not resonant at the Larmor frequency of the magnetic resonance system.

Furthermore, a choke is connected in parallel with the patient bed coupling element 9 such that the patient bed coupling element 9 and the choke 33 form a radio-frequency trap circuit at the Larmor frequency of the magnetic resonance system. Given capacitive coupling, the patient bed coupling element 9 is also fashioned such that it detunes the local coil 8 when the local coil 8 cannot be coupled to the evaluation device 7.

Figure 16:
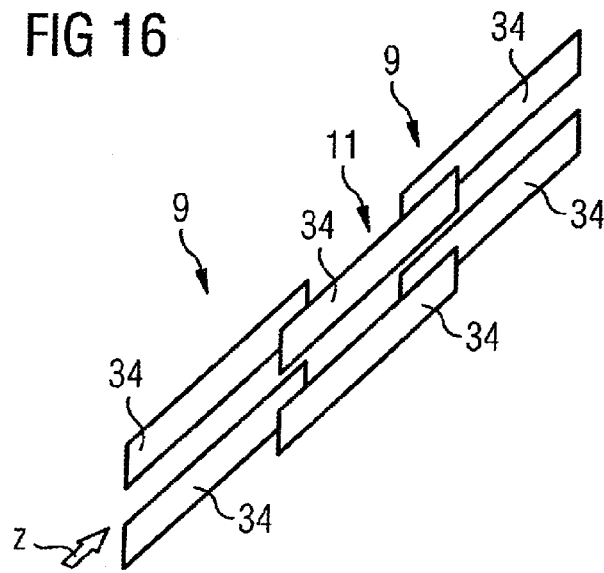
FIGS. 16 and 17 illustrate different embodiments of coupling elements.
Figure 17:
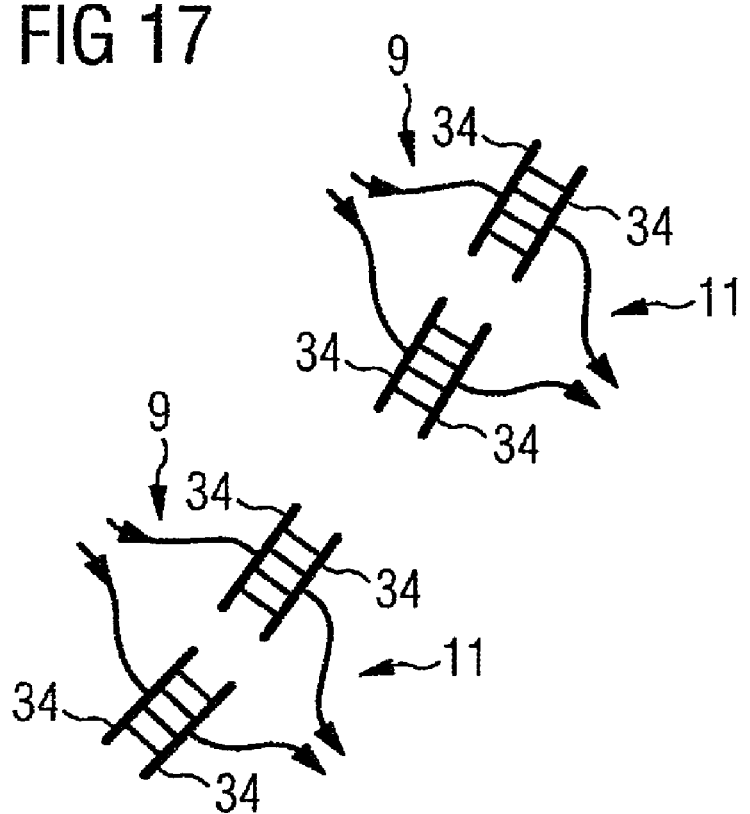

The coupling elements 9, 11 (this applies both for the patient bed coupling elements 9 and for the base body coupling elements 11) are advantageously respectively fashioned as a pair of narrow coupling strips 34 according to FIGS. 16 and 17. The coupling strips 34 of each coupling element 9, 11 are thereby advantageously adjacent to one another at their narrow sides to minimize the unavoidable parasitic capacitance between them.

The embodiments of the present invention described in the preceding exclusively concern the transfer of a magnetic resonance signal form the local coils 8 to the evaluation device 7. The local coils 8 are thus operated as acquisition coils. However, according to FIG. 18 it is also possible to operate the local coils 8 as transmission coils. This applies independent of whether the coupling elements 9, 11 are fashioned as capacitive or inductive coupling elements 9, 11.

Figure 18:
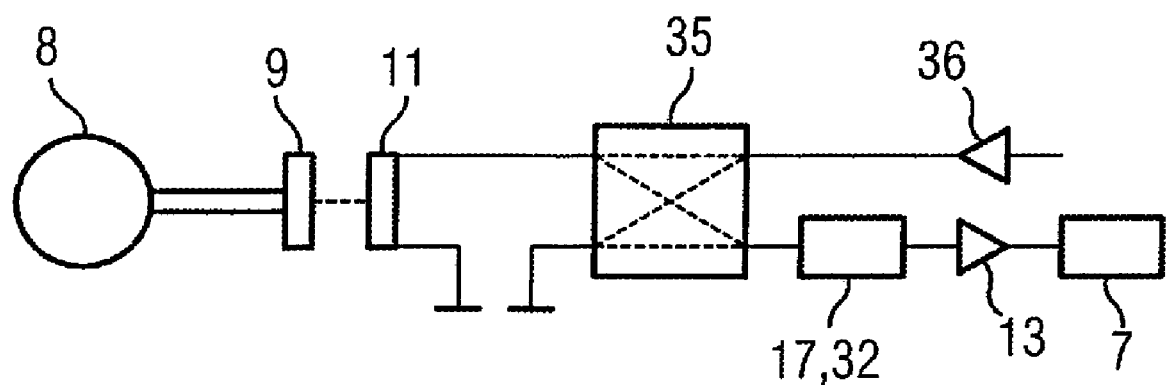
FIG. 18 shows a further embodiment of the inventive arrangement of coupling elements.

According to FIG. 18, a signal splitter 35 is arranged between the base body coupling element 11 and the evaluation circuit 7. The signal splitter 35 is connected with an RF driver element 36. It is thus possible to feed a magnetic resonance excitation signal that is emitted by the RF driver element 36 into the local coil 8 via the base body coupling element 11 and the patient bed coupling element 9. This naturally applies only when the patient bed 5 is moved such that corresponding coupling elements 9, 11 couple with one another (see FIGS. 6 and 7).

The following features of the present invention are mentioned briefly in conclusion:

The connection lines from the local coils 8 to the patient bed coupling elements 9 are advantageously relatively short. It is therewith ensured that the local coils 8 are also actually arranged in the excitation region 2 (and thus can acquire a magnetic resonance signal) when they are coupled to the evaluation device 7 via one of the base body coupling elements 8.

The base body coupling elements 11 are advantageously permanently arranged on the base body 1. However, they can also be connected with the base body 1 such that they can be detached.

It is possible that the local coils 8 and the patient bed coupling elements 9 are combined into inseparable units. In this case the patient bed 5 advantageously comprises guides so that the patient bed coupling elements 9 can be positioned exactly. However, the patient bed coupling elements 9 can also be separable from the local coils 8. In this case it is possible (but not necessary) to arrange the patient bed coupling elements 9 on the patient bed 5 in a fixed manner. The connection between the local coils 8 and the patient bed coupling elements 9 can in this case be fashioned corresponding to DE-C2-101 30 615, for example.

Further local coils 37 are recognizable under the patient bed 5 in FIG. 2. These local coils 37 can be connected with the evaluation device 7 corresponding to the present invention. However, this is only required when these local coils 37 are arranged at the patient bed 5. However, it is also possible to arrange these local coils 37 stationary at the base body 1, above the patient bed 5.

Although modifications and changes may be suggested by those skilled in the art, it is the intention of the inventors to embody within the patent warranted heron all changes and modifications as reasonably and properly come within the scope of their contribution to the art.

The invention claimed is:

1. A magnetic resonance system comprising:
   a base body comprising a magnet system that generates magnetic fields in an examination region of the base body;
   a patient bed that is movable in a travel direction through a travel region relative to the base body, said patient bed being configured to receive an examination subject thereon to move the examination subject through the examination region;
   an antenna arrangement operable in combination with said magnet system to interact with the examination subject to generate magnetic resonance signals in and receive magnetic signals from the examination subject, said antenna arrangement comprising a local coil configured at least to detect said magnetic resonance signals;
   an evaluation device that evaluates the magnetic resonance signals detected by the local coil;
   a base body coupling element connected to said evaluation device, said base body coupling element being located at a predetermined base body location;
   a patient bed coupling element connected to said local coil, said patient bed coupling element being located at a predetermined patient bed location at the patient bed, said base body coupling element and said patient bed coupling element being respectively configured and located to couple inductively or capacitively with each other to feed the magnetic resonance signals detected by said local coil from the local coil via the patient bed coupling element and the basic body coupling element to the evaluation device.

2. A magnetic resonance system as claimed in claim 1 wherein said local coil is a first local coil, said patient bed coupling element is a first patient bed coupling element and said predetermined patient bed location is a first predetermined patient bed location, and wherein said first patient bed coupling element couples inductively or capacitively with said base body coupling element when and as long as the patient bed has moved by a predetermined first segment of said travel region, and comprising a second local coil that acquires said magnetic resonance signal and a second patient bed coupling element connected with said second local coil at said patient bed at a second predetermined bed location, said second patient bed coupling element being arranged in said travel direction, in line with the patient bed coupling element and being configured to couple capacitively or inductively with the base body coupling element when and as long as the patient bed has moved by a predetermined second segment of the travel region to feed the magnetic resonance signal acquired by the second local coil, via the second patient bed coupling element of the base body coupling element, to said evaluation device.

3. A magnetic resonance system as claimed in claim 2 wherein said predetermined first segment and said predetermined second segment overlap each other in an overlap region.

4. A magnetic resonance system as claimed in claim 3 wherein said first segment and said second segment have an equal size, and wherein said overlap region is approximately one-half of said size.

5. A magnetic resonance system as claimed in claim 2 wherein said base body coupling element is a first base body coupling element and said predetermined base body location is a first predetermined base body location, and wherein said patient bed coupling element couples inductively or capacitively with said first base body coupling element when and as long as the patient bed has moved by a predetermined first segment of said travel region, and comprising a second base body coupling element connected with the evaluation device at a second predetermined base body location at said base body, said second base coupling element being arranged in said travel direction, in line with said first base body coupling element and being configured to couple capacitively or inductively with the patient bed coupling element as long as the patient bed has moved by a predetermined second segment of said travel region to feed the magnetic resonance signal acquired by the first local coil via the first patient bed coupling element and the second base body coupling element to said evaluation device.

6. A magnetic resonance system as claimed in claim 5 wherein said third segment has a size identical with said second segment.

7. A magnetic resonance system as claimed in claim 2 comprising a preamplifier connecting said base body coupling element with said evaluation device.

8. A magnetic resonance system as claimed in claim 2 wherein said excitation region extends through an excitation region length along said travel direction, said excitation region length being a multiple of a size of said segment.

9. A magnetic resonance system as claimed in claim 8 wherein said travel region has a travel region length that is a multiple of said excitation region length.

10. A magnetic resonance system as claimed in claim 1 wherein said patient bed coupling element detunes said local coil when said local coil is not coupled to the evaluation device via said patient bed coupling element and said base body coupling element.

11. A magnetic resonance system as claimed in claim 1 wherein each of said base body coupling element and said patient bed coupling element is an inductive coupling element.

12. A magnetic resonance system as claimed in claim 11 comprising a capacitive transformation circuit, comprising a plurality of capacitors, connected between said patient bed coupling element and said local coil.

13. A magnetic resonance system as claimed in claim 11 wherein said patient bed coupling element comprises a first patient bed conductor loop and a second patient bed conductor loop, said first and second patient bed conductor loops each generating a temporally variable magnetic field upon feed of said magnetic resonance signal from said local coil to said evaluation device, each temporally variable magnetic field being oriented perpendicularly to said travel direction and the respective temporally variable magnetic fields generated by the first and second patient bed conductor loops being oriented inversely to each other at all points in time, and wherein said base body coupling element comprises a first base body conductor loop and second base body conductor loop, and wherein the respective temporally variable magnetic fields generated by said first and second patient bed conductor loops induce temporally variable induction currents in said first and second base body conductor loops, said induction currents having respective polarities that are opposite to each other at all points in time.

14. A magnetic resonance system as claimed in claim 11 comprising a whole-body antenna that generates a substantially homogenous radio frequency field in an entirety of the excitation region, said whole-body antenna comprising a plurality of transmission elements oriented parallel to said travel direction, and wherein said base body coupling element is disposed between two immediately adjacent ones of said plurality of transmission elements.

15. A magnetic resonance system as claimed in claim 11 comprising a whole-body antenna that generates a substantially homogenous radio frequency field in an entirety of the excitation region, said whole-body antenna comprising a plurality of transmission elements oriented parallel to said travel direction, and wherein said base body coupling element is integrated into one of said plurality of transmission elements.

16. A magnetic resonance system as claimed in claim 15 wherein each of said first and second base body conductor loops is comprised of a plurality of segments proceeding parallel to said travel direction, said segments respectively having capacitors connected therein that are dimensioned to cause an excitation current oscillating in said one of said transmission elements to produce no signal in said base body coupling elements.

17. A magnetic resonance system as claimed in claim 1 wherein each of said base body coupling element and said patient bed coupling element is a capacitive coupling element.

18. A magnetic resonance system as claimed in claim 17 wherein each of said patient bed coupling element and said base body coupling element is formed as a pair of narrow coupling strips.

19. A magnetic resonance system as claimed in claim 18 wherein each of the coupling strips of said patient bed coupling element has a narrow side, and wherein the coupling strips of said patient bed coupling element are adjacent to each other at said narrow sides.

20. A magnetic resonance system as claimed in claim 17 comprising a choke connected in parallel with said patient bed coupling element.

21. A magnetic resonance system as claimed in claim 17 comprising a protective circuit connected between said base body coupling element and said evaluation circuit that compensates a series blind resistance formed by said first coil, said patient bed coupling element and said base body coupling element upon feed of the magnetic resonance signal from the local coil to the evaluation circuit via said patient bed coupling element and said base body coupling element, and said protective circuit detuning said base body coupling element when no patient bed coupling element interacts therewith.

22. A magnetic resonance system as claimed in claim 1 wherein said base body coupling element is disposed in said excitation region.

23. A magnetic resonance system as claimed in claim 1 comprising a controllable blocking circuit that selectively detunes said base body coupling element.

24. A magnetic resonance system as claimed in claim 1 comprising a signal splitter connected between said base body coupling element and said evaluation circuit, said signal splitter being connected to a radio frequency driver element that emits a magnetic resonance excitation signal that is fed via the base body coupling element and the patient bed coupling element into the local coil, and is radiated from said local coil, when and as long as said patient bed is moved by said segment.

* * * * *